United States Patent [19]

Seevinck et al.

[11] Patent Number: 5,047,657
[45] Date of Patent: Sep. 10, 1991

[54] INTEGRATED CIRCUIT COMPRISING A SIGNAL LEVEL CONVERTER

[75] Inventors: Evert Seevinck; Jan Dikken; Hans-Jürgen O. Schumacher, all of Eindhoven, Netherlands

[73] Assignee: U.S. Philips Corporation, New York, N.Y.

[21] Appl. No.: 402,002

[22] Filed: Sep. 1, 1989

[30] Foreign Application Priority Data

May 10, 1989 [NL] Netherlands ............... 8901170

[51] Int. Cl.⁵ ................. H03K 5/00; H03K 19/094
[52] U.S. Cl. ..................... 307/264; 307/359; 307/362; 307/475
[58] Field of Search ............... 307/264, 355, 359, 362, 307/475

[56] References Cited

U.S. PATENT DOCUMENTS

| | | | |
|---|---|---|---|
| 4,410,813 | 10/1983 | Barker et al. | 307/362 |
| 4,551,642 | 11/1985 | Aizawa et al. | 307/362 |
| 4,603,267 | 7/1986 | Kowallek | 307/362 |
| 4,677,321 | 6/1987 | Bacrania | 307/475 |
| 4,697,110 | 9/1987 | Masuda et al. | 307/475 |
| 4,763,021 | 8/1988 | Stickel | 307/475 |
| 4,791,318 | 12/1988 | Lewis et al. | 307/362 |
| 4,845,388 | 7/1989 | Amatangelo | 307/475 |

Primary Examiner—John Zazworsky
Attorney, Agent, or Firm—Bernard Franzblau

[57] ABSTRACT

An integrated circuit which includes a converter for converting a logic input signal of a first logic type into a logic output signal of a second logic type, for example, from ECL to CMOS level. The converter comprises a buffer, including a controllable load and a driver transistor, and a control circuit. The load is controlled as a function of a control voltage and a reference voltage which are externally applied so that the output signal is substantially equal to the reference voltage if the input signal is substantially equal to the control voltage. In one embodiment the control circuit is a copy of the buffer and receives the control voltage at its input. Its load is controlled by a differential amplifier whose inputs receive the reference voltage and the output voltage of the control circuit. A CMOS-SRAM comprising ECL/CMOS level converters of the above kind communicates with fast ECL circuits and has a low energy consumption.

16 Claims, 2 Drawing Sheets

INTEGRATED CIRCUIT COMPRISING A SIGNAL LEVEL CONVERTER

This invention relates to an integrated circuit comprising a converter for transforming, under the control of a control voltage, an input signal voltage having a first and a second extreme value, and received at an input terminal, into an output signal voltage having a third and a fourth extreme value and which appears at an output terminal.

STATE OF THE ART

An integrated circuit of this kind is, inter alia, known from the article "A 2-μm CMOS Digital Adaptive Equalizer Chip for QAM Digital Radio Modems", S. R. Meier et al., IEEE JSSC 23(5), October 1988, pp. 1212-1217, FIG. 8. The known converter is a CMOS input buffer for converting ECL-level signals into CMOS-level signals. To this end, the converter is composed of a differential pair comprising NMOS input transistors having gate electrodes which receive the input signal and the control voltage. Between a common node of the transistor pair on the one side and a first power supply terminal ($V_{SS}$) on the other side, there is arranged a reference current source. Both input transistors are loaded by the input capacitances of respective PMOS current mirrors. The output of one PMOS current mirror is connected, via an NMOS current mirror, to the output of the other PMOS current mirror. An input of a CMOS inverter circuit is connected to the node between the latter two current mirrors in order to supply the output signal. The comparatively long delay (from 8 to 11 ns) occurring upon switching is a drawback of the known converter. This delay is caused, inter alia, by the comparatively large capacitive load at the outputs of the differential pair. Both outputs are loaded, inter alia, by the gate capacitances of the PMOS transistors forming the relevant current mirrors. A reduction of said gate capacitances, whose value is proportional to the width of the relevant current channel, is not feasible. The voltage drop across the relevant transistors would then increase so that the voltage across the input transistors would decrease. The transconductance of the input transistors would then be lowered, thus reducing the speed of switching. Another cause of the slow operation is the biasing of the transistors in the differential pair. Because at least one threshold voltage is already present across the load diode-connected to this transistor, the relevant transistor will operate near or in its triode range. Consequently, its transconductance is small and the current variations upon switching are also small.

Another drawback of the known circuit is that its accuracy is co-determined by the cooperation of the non-correlated properties of the PMOS and NMOS transistors, for which no compensation takes place.

U.S. Pat. No. 4,763,021 (8/9/88) describes a CMOS input buffer circuit for converting TTL or CMOS input voltage signals to CMOS signals in order to drive CMOS loads. The subject matter of this U.S. patent is hereby incorporated by reference.

OBJECT OF THE INVENTION

Therefore, it is, inter alia, an object of the invention to provide an integrated circuit of the kind set forth which is faster at substantially the same current consumption and is more accurate. It is to be noted that the use of a circuit in accordance with the invention is not necessarily restricted to the conversion from ECL-level to CMOS level or to logic signals.

SUMMARY OF THE INVENTION

To this end, an integrated circuit of the kind set forth is characterized in that the converter comprises:
  a buffer which comprises a current path which includes a current channel of a driver transistor which is connected to a first power supply terminal, and a controllable load which is connected to a second power supply terminal. The input terminal is coupled to a control electrode of the driver transistor and the output terminal is coupled to the current path between the load and the driver transistor.
  A control circuit is provided for controlling the load under the control of both the control voltage and a reference voltage so that the output signal voltage is substantially equal to the reference voltage if the input signal voltage is substantially equal to the control voltage.

On the basis of the mutually independent control voltage and the reference voltage the control circuit adjusts the load in order to ensure that the trip point of the buffer is fixed. The switching components comprise only the buffer with a load and a driver transistor. The control circuit is preferably constructed so that compensation is possible for temperature effects, supply voltage fluctuations and spreads in the process parameters. An optimum bias can be achieved by control of the control voltage and the reference voltage, if necessary.

In any steady output state of the buffer there is a balance between the current supplied by the load and the current drained by the driver. By keeping the current through the driver constant, the output voltage of the buffer can be controlled by controlling the load current.

The load control is arranged so that when the input voltage to the driver equals the control voltage, the buffer supplies an output voltage equal to the reference voltage. The load is adjusted under the control of the reference voltage and the control voltage in order to fix a point in the input/output characteristic of the buffer. Thus the operation of the circuit is centered on the controllable load in the buffer. This load is controlled by the control circuit which interrelates the reference voltage and the control voltage. By controlling the load the trip point of the buffer is controlled.

In other words, the reference voltage and the control voltage balance the control circuit such that the load's current balances the driver's current when the input voltage equals the control voltage in order to produce a buffer output voltage equal to the reference voltage.

An embodiment of an integrated circuit in accordance with the invention is characterized in that the control circuit comprises:
  a second buffer which comprises a current path which includes a current channel of a second driver transistor which is connected to the first power supply terminal, and a controllable second load which is connected to the second power supply terminal, the second driver transistor being controllable by the control voltage;
  a differential amplifier for controlling the first and the second load in dependence on a difference between the reference voltage and an output voltage of the second buffer.

The control circuit now comprises a feedback loop which includes a second buffer and a differential amplifier. The ratio of the control voltage to the output voltage of the second buffer is indicative of the ratio of the input voltage to the output voltage of the first buffer. Preferably, the first and the second driver transistor and the first and the second load are copies of one another, possibly with the exception of a geometrical scale factor. This symmetry benefits the accuracy of the control loop. The highest accuracy is achieved when the buffers are identical. Temperature effects, supply voltage fluctuations and spreads in process parameters are then compensated for by means of the feedback loop.

Another embodiment of an integrated circuit in accordance with the invention is characterized in that the load and the driver transistor in the first buffer are controllable in a mutually opposed manner, a capacitance being inserted between the control terminal of the load and the input terminal.

Because of the capacitive coupling between the input terminal and the control terminal, the load is actively controlled in the case of input voltage transitions fluctuation. Because the driver transistor and the load can be controlled in a mutually opposed manner, the voltage on the output terminal will respond more quickly than in the absence of the capacitive coupling.

A further embodiment of an integrated circuit in accordance with the invention includes a control circuit which also comprises:
- a second buffer which comprises a current path which includes a current channel of a second driver transistor which is connected to the first power supply terminal and a controllable second load which is connected to the second power supply terminal, the second driver transistor being controllable by the control voltage;
- a differential amplifier for controlling the first and the second load in dependence on a difference between the reference voltage and an output voltage of the second buffer, wherein the first load and the first driver transistor in the first buffer are controllable in a mutually opposed manner, a capacitance being arranged between a control terminal of the first load and the input terminal, and a resistance being arranged between the control terminal and the differential amplifier.

The resistance ensures that a voltage variation at the control terminal does not disappear directly into the power supply via the low output impedance of the differential amplifier. Moreover, the combination formed by the capacitance and the resistance enhances the stability of the feedback loop by way of phase compensation.

Embodiments in which at least the control voltage or the reference voltage can be controlled find a wide field of application. For example, one and the same integrated circuit in accordance with the invention, constructed in CMOS technology, will be suitable for converting logic signals of at least one of the following types: ECL level, TTL level, S-TTL level, I²L level, to the CMOS level by adaptation of the control voltage and the reference voltage.

A further embodiment of an integrated circuit in accordance with the invention is characterized in that it comprises a CMOS SRAM, a CMOS converter being connected to an input thereof. When the converter is suitable, for example, for converting ECL signals to the CMOS level, a SRAM is realized which is capable of cooperating directly with (fast) ECL circuits and which has a low energy consumption and a high packing density in accordance with the properties of CMOS circuits. A combination of, for example, a CMOS gate array and such converters offers similar advantages.

BRIEF DESCRIPTION OF THE DRAWINGS

The invention will be described in detail hereinafter with reference to the accompanying drawing; in which.

DESCRIPTION OF THE PREFERRED EMBODIMENTS

Figure 1A:
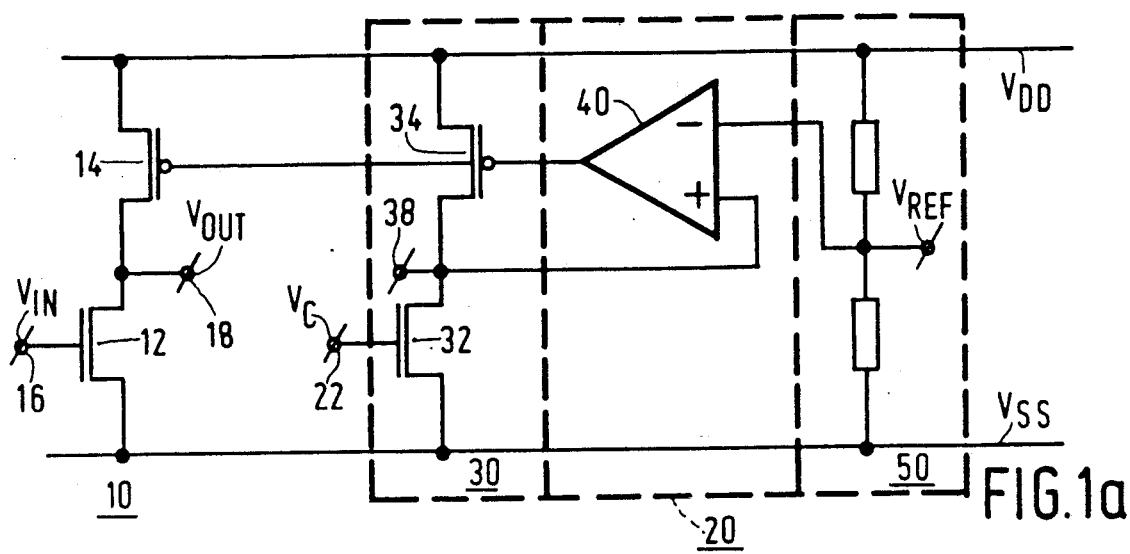
FIGS. 1a and 1b show a first embodiment of an integrated circuit in accordance with the invention.

FIG. 1a shows a first embodiment of an integrated circuit in accordance with the invention which is constructed in CMOS technology by way of example.

The circuit comprises an inverter circuit 10 with a driver transistor 12 of the NMOS type and a load transistor 14 of the PMOS type. Input 16 of the inverter circuit 10 receives an input signal voltage $V_{IN}$, which varies between two predetermined voltage values, for example $V_A$ and $V_B$. For example, if $V_{IN}$ is a logic signal at the ECL level, $V_A$ and $V_B$ are voltages that are 0.95 V below $V_{DD}$ and 1.7 V below $V_{DD}$, respectively. Output signal $V_{OUT}$ at output terminal 18 is indicative of the instantaneous value of the input signal $V_{IN}$, but represents a version thereof which has been translated to the CMOS level.

For optimum conversion of the input signal $V_{IN}$ to the output signal $V_{OUT}$ it is, inter alia, necessary for $V_{OUT}$ to be situated approximately halfway between $V_{DD}$ and $V_{SS}$ when the input signal $V_{IN}$ lies approximately halfway between $V_A$ and $V_B$. To this end, the circuit is provided with a control circuit 20 which controls the current through the load transistor 14 in dependence on the control voltage $V_C$ at control input 22.

The control circuit 20 comprises a second inverter circuit 30 consisting of a driver transistor 32 and a load transistor 34 which are of the NMOS type and the PMOS type, respectively. The load transistor 34 is controlled by means of a negative feedback loop. The feedback loop comprises a differential amplifier 40, a noninverting input of which is connected to an output 38 of the second inverter circuit 30, and an inverting input being connected to a voltage divider 50 in order to receive a reference voltage $V_{REF}$. An output of said amplifier 40 is connected to the interconnected gate electrodes of the load transistors 14 and 34. For a given control voltage $V_C$ and a given reference voltage $V_{REF}$, the differential amplifier 40 controls the current through the load transistor 34 so that the voltage on the output 38 is substantially equal to $V_{REF}$. The load transistor 14 receives the same control voltage as the load transistor 34. Assume that the construction of the inverter circuits 10 and 30 is identical, except possibly for a geometrical scale factor. In that case the output voltage $V_{OUT}$ of the inverter circuit 10 will be substantially equal to the reference voltage $V_{REF}$ if the input voltage $V_{IN}$ is substantially equal to the control voltage $V_C$. For example, when the control voltage $V_C$ is adjusted to a value approximately 1.32 V below $V_{DD}$, an input buffer for converting ECL signals to the CMOS level has been realized. The control circuit 20 can also control one or more buffer circuits 10' similar to the buffer circuit 10. The output of differential amplifier 40 will then also be coupled to a control electrode of a load transistor (not shown) in buffer 10'.

Figure 1B:
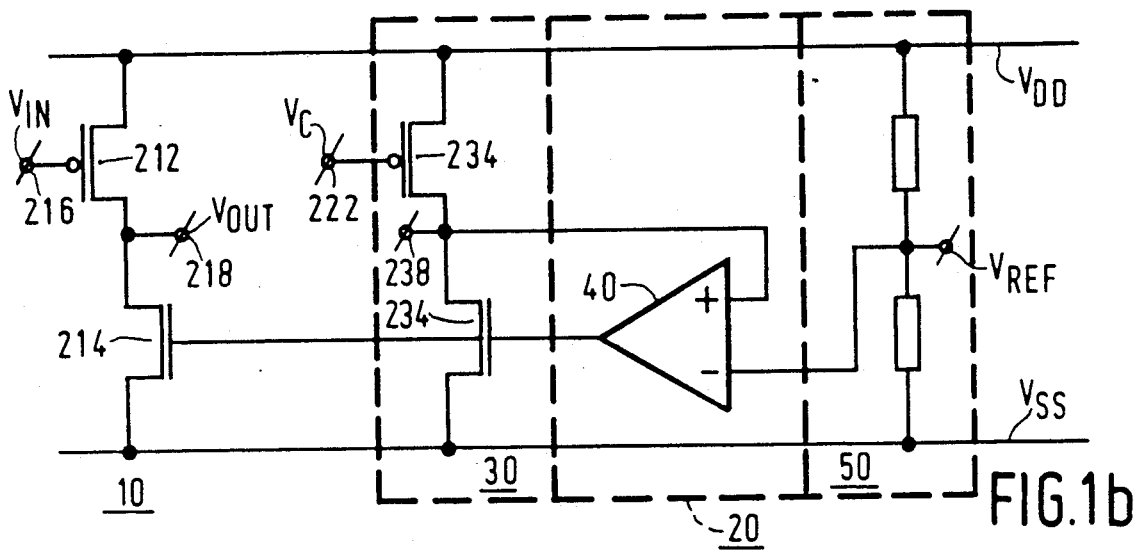

FIG. 1b shows a first embodiment of an integrated memory circuit in accordance with the invention which is substantially identical to that shown in FIG. 1a, except for the interchanged supply voltages $V_{DD}$ and $V_{SS}$ and the interchanged PMOS and NMOS transistors. A driver transistor 212 in the first inverter circuit 10 is now of the PMOS type and receives the input voltage $V_{IN}$ at input terminal 216. In the second inverter circuit 30 a PMOS transistor 234 receives a control voltage $V_C$ via control terminal 222. NMOS load transistors 214 and 232 are controlled by the fed back differential amplifier 40. As has already been described with reference to FIG. 1a, the output voltage $V_{OUT}$ at the output terminal 218 will again be substantially equal to the reference voltage $V_{REF}$ if the input voltage $V_{IN}$ is substantially equal to the control voltage $V_C$. This embodiment is to be preferred over the embodiment shown in FIG. 1a if the lowest extreme value of the signal voltage $V_{IN}$ is below the threshold of the NMOS transistor 12 of FIG. 1a. If this still would be the case, at least distortions of the output signal $V_{OUT}$ would occur and possibly also a loss of information. Similar considerations hold good mutatis mutandis for the embodiment shown in FIG. 1b if the highest extreme value of the signal voltage $V_{IN}$ is within the voltage range between $V_{DD}$ minus a threshold of the driver transistor 212 and $V_{DD}$.

For example, when a logic TTL having logic values of 0.2 V above $V_{SS}$ and 2.5 V above $V_{SS}$ is chosen for $V_{IN}$ and $V_C$ is adjusted to a value 1.35 V above $V_{SS}$, an input buffer for TTL signals to the CMOS level has been realized. Depending, inter alia, on the technology in which the integrated circuit can be constructed (CMOS, NMOS, bipolar, MESFET, etc.), the foregoing can in principle be used for the conversion of signals of different logic families (CMOS, TTL, S-TTL, ECL, I²L, etc.). Similarly, the foregoing can also be used for realizing fast comparators having a small offset.

Figure 2:
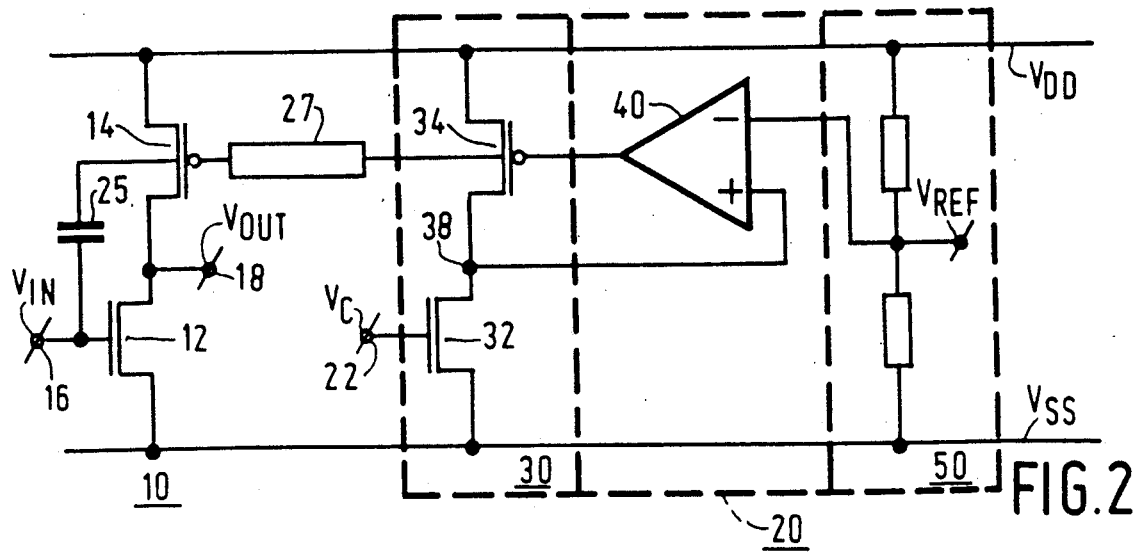
FIG. 2 shows a second embodiment.

FIG. 2 shows a second circuit diagram of an integrated circuit in accordance with the invention which is again constructed, by way of example, in CMOS technology as in the previous Figure. References which correspond to those of the previous Figure refer to identical or corresponding parts and components.

The circuit shown in FIG. 2 deviates from that shown in FIG. 1a in that a capacitance 25 is added between the gate electrodes of the driver transistor 12 and the load transistor 14 in the inverter circuit 10 and in that a resistance 27 is added between the gate electrode of the load transistor 14 and the output of the differential amplifier 40. The capacitive coupling between the gate electrodes of the transistors 12 and 14 provides active control of the load transistor 14 during the transition of the voltage level of the input signal $V_{IN}$ at the input 16. Therefore, this embodiment is faster than that shown in the preceding Figure. The resistance 27 is provided, inter alia, in order to prevent the voltage variations at the gate electrode of the load transistor from disappearing immediately into the power supply via the (very low) output impedance of the differential amplifier 40. The resistance 27 has no effect on the d.c. biasing of the load transistor 14 as long as the control voltage $V_C$ remains constant. The combination formed by the capacitance 25 and the resistance 27 also acts as a phase compensation in the previously mentioned feedback loop in order to prevent the occurrence of instabilities.

It is also to be noted that the gate delay of the circuits shown is shorter than the gate delay of a conventional CMOS inverter circuit if in the circuits of the FIGS. 1a and 2 $V_C$ is larger than $\frac{1}{2} (V_{DD} - V_{SS})$ and $V_C$ is smaller than $\frac{1}{2} (V_{DD} - V_{SS})$ in the circuit shown in FIG. 1b. This is because of the mutually independent bias of the driver transistor 12 and the load transistor 14, which bias enables the sum of the gate-source voltages, in as far as DC components are concerned, to be considerably larger than in the case of a conventional CMOS inverter circuit. This implies a greater transconductance for the circuit in comparison with the conventional CMOS gate composed of the same transistors.

Figure 3:
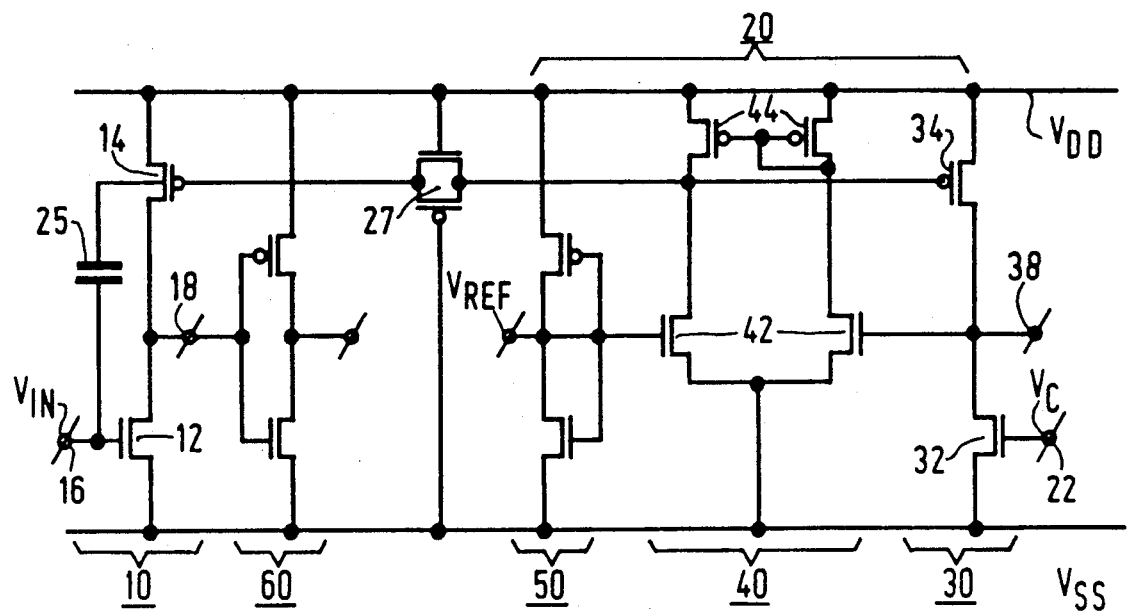
FIG. 3 shows a transistor diagram illustrating the embodiment of FIG. 2.

FIG. 3 shows a transistor diagram as an example of the implementation of the circuit shown in FIG. 2. References which correspond to the preceding Figures again refer to identical or corresponding parts.

The differential amplifier 40 now comprises a transistor differential pair 42 with a current mirror 44 as a load. One input of the differential amplifier 40 is connected to the output of the inverter circuit 30, the other input being connected to a voltage divider 50 which comprises a standard CMOS inverter gate whose input and output are interconnected. An impedance 27 comprises a parallel combination of current channels of a PMOS transistor and an NMOS transistor whose gate electrodes are connected to the power supply terminals for connection to $V_{SS}$ and $V_{DD}$ respectively. As is known, the use of this parallel combination prevents the occurrence of threshold losses. An additional inverter circuit 60 for increasing the voltage swing at the output of the circuit may also be connected to the output 18 of the inverter circuit 10. A gate delay of 0.6 ns and a power consumption of 1.1 mA have been determined experimentally for a circuit as shown in the transistor diagram, realized in a sub-micron CMOS process, for conversion from ECL to CMOS level with a power supply ($V_{DD} - V_{SS}$) of 4.5 V ±5% and for a temperature range of from 0° C. to 125° C.

Figure 4:
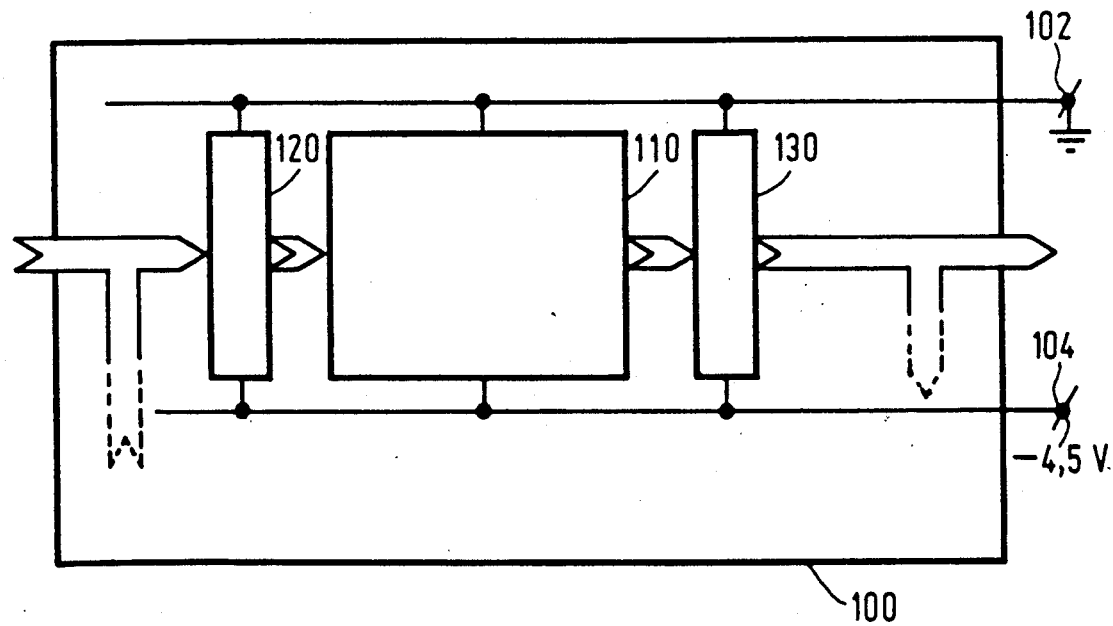
FIG. 4 shows an example of a memory circuit in accordance with the invention.

FIG. 4 shows an example of the use of an integrated circuit in accordance with the invention as a memory circuit. There are shown an IC 100 with power supply terminals 102 and 104 for connection to ECL level supply voltages of 0 V and −4.5 V, respectively. The IC 100 comprises a CMOS-SRAM 110 which is connected between the terminals 102 and 104. Alternatively, the IC 100 could comprise a CMOS gate array (110) instead of the CMOS-SRAM. For the communication, and hence for level adaptation of the signals, there are provided an input buffer 120 and an output buffer 130 for converting ECL level signals to the CMOS level and for converting CMOS level signals to the ECL level, respectively. The IC 100 may also be provided with data processing circuits (not shown) which operate at the ECL level as denoted by arrows in broken lines which indicate a feasible data transport route.

Such a set-up combines the low energy consumption of a CMOS-SRAM and the high data processing speed of ECL systems, the IC 100 being fully ECL compatible. The input buffer 120 comprises, for example, the circuit shown in FIG. 3.

We claim:

1. An integrated converter circuit for transforming, under the control of a control voltage, an input signal voltage having a first and a second extreme value on an input terminal into an output signal voltage having a third and a fourth extreme value on an output terminal, comprising:

a buffer which comprises a current path which includes a current channel of a driver transistor connected to a first power supply terminal, and a controllable load connected to a second power supply terminal, the input terminal being coupled to a control electrode of the driver transistor, the output terminal being coupled to a current path between the load and the driver transistor;

a control circuit for controlling the load under the control of both the control voltage and a reference voltage so that the output signal voltage is substantially equal to the reference voltage if the input signal voltage is substantially equal to the control voltage, and a capacitance connected between a control terminal of the load and the input terminal whereby the load and the drive transistor are controllable in a mutually opposed manner.

2. An integrated circuit as claimed in claim 1, wherein the control circuit comprises:

a second buffer which comprises a current path which includes a current channel of a second driver transistor connected to the first power supply terminal, and a controllable second load connected to the second power supply terminal, the second driver transistor being controlled by the control voltage;

a differential amplifier for controlling the first and the second loads in dependence on a difference between the reference voltage and an output voltage of the second buffer, and a resistance connected between the control terminal and the differential amplifier.

3. An integrated circuit as claimed in claim 2, wherein the second driver transistor and the second controllable load are similar to the first driver transistor and the first controllable load, respectively.

4. An integrated circuit as claimed in claim 2, wherein the second buffer is similar to the first buffer.

5. An integrated circuit as claimed in claim 1, wherein at least the control voltage or the reference voltage is controllable.

6. An integrated circuit as claimed in claim 1 further comprising at least one other buffer coupled to said control circuit so that said buffer and said at least one other buffer are controlled in common by said control circuit.

7. An integrated circuit as claimed in claim 1, constructed in CMOS technology and suitable for converting logic input signals of at least one of the following types: ECL level, TTL level, S-TTL level, I$^2$L level, to the CMOS level.

8. An integrated circuit as claimed in claim 7 comprising a CMOS-SRAM having an input coupled to the buffer.

9. An integrated circuit as claimed in claim 7, comprising a CMOS gate array having an input coupled to the buffer.

10. An integrated circuit as claimed in claim 2, further comprising at least one other buffer coupled to said control circuit so that the first buffer and said at least one other buffer are controlled in common by said control circuit.

11. An integrated circuit comprising:

a voltage level converter which includes a driver transistor and a load transistor coupled in series circuit between first and second supply voltage terminals, a signal voltage input terminal coupled to at least a control electrode of the driver transistor, an output terminal of the integrated circuit connected between said driver transistor and said load transistor, a control circuit having an output coupled to a control electrode of the load transistor and having first and second control terminals for controlling the load transistor as a function of a control voltage applied to said first control terminal and a reference voltage applied to said second control terminal such that an output signal voltage at the output terminal of the integrated circuit is substantially equal to the reference voltage when an input signal voltage at said signal voltage input terminal is substantially equal to said control voltage, and means for coupling said control electrode of the load transistor to the signal voltage input terminal thereby to control the driver transistor and the load transistor in a mutually opposed manner.

12. An integrated circuit as claimed in claim 11 wherein said coupling means comprises a capacitance device.

13. An integrated circuit as claimed in claim 12 wherein said control circuit further comprises:

a second driver transistor and a second load transistor connected in a second series circuit between said first and second supply voltage terminals, a differential amplifier having a first input coupled to said second control terminal and a second input coupled to a circuit point between the second driver transistor and the second load transistor, second means coupling an output of the differential amplifier to a control electrode of the second load transistor and to said output of the control circuit, and means connecting said first control terminal to a control electrode of the second driver transistor.

14. An integrated circuit as claimed in claim 11 wherein said control circuit further comprises:

a second driver transistor and a second load transistor connected in a second series circuit between said first and second supply voltage terminals, a differential amplifier having a first input coupled to said second control terminal and a second input coupled to a circuit point between the second driver transistor and the second load transistor, second means coupling an output of the differential amplifier to a control electrode of the second load transistor and to said output of the control circuit, and means connecting said first control terminal to a control electrode of the second driver transistor.

15. An integrated circuit as claimed in claim 14 wherein the first coupling means comprises:

a capacitance device coupling said control electrode of the first load transistor to the signal voltage input terminal, and a resistance device coupled between the control electrodes of the first and second load transistors.

16. An integrated circuit as claimed in claim 11 wherein at least one of the voltages at said first and second control terminals of the control circuit is controllable.

* * * * *